United States Patent
Sapra et al.

(10) Patent No.: US 8,546,016 B2
(45) Date of Patent: Oct. 1, 2013

(54) SOLUTIONS FOR CLEANING SEMICONDUCTOR STRUCTURES AND RELATED METHODS

(75) Inventors: Sanjeev Sapra, Boise, ID (US); Niraj Rana, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/986,770

(22) Filed: Jan. 7, 2011

(65) Prior Publication Data

US 2012/0178257 A1    Jul. 12, 2012

(51) Int. Cl.
H01M 6/04      (2006.01)
H01M 6/16      (2006.01)
B08B 3/00      (2006.01)

(52) U.S. Cl.
USPC ............... 429/204; 429/189; 429/324; 134/28

(58) Field of Classification Search
USPC ............. 438/675, 253, 396, 693; 134/26, 134/28; 429/189, 324, 204
See application file for complete search history.

(56) References Cited

U.S. PATENT DOCUMENTS

| | | | |
|---|---|---|---|
| 5,601,656 A * | 2/1997 | Li | 134/2 |
| 6,306,759 B1 | 10/2001 | Yen et al. | |
| 6,458,650 B1 * | 10/2002 | Huang et al. | 438/253 |
| 7,084,059 B2 * | 8/2006 | Thomas et al. | 438/674 |
| 7,592,650 B2 | 9/2009 | Hshieh | |
| 2002/0036353 A1 * | 3/2002 | Song et al. | 257/774 |
| 2004/0266180 A1 * | 12/2004 | Dauch et al. | 438/675 |
| 2005/0266689 A1 * | 12/2005 | Small et al. | 438/693 |
| 2006/0063308 A1 * | 3/2006 | Shim | 438/115 |
| 2006/0273380 A1 | 12/2006 | Hshieh | |
| 2006/0273384 A1 | 12/2006 | Hshieh | |
| 2008/0179662 A1 | 7/2008 | Hshieh | |
| 2009/0065735 A1 * | 3/2009 | Kolics et al. | 252/79.1 |

OTHER PUBLICATIONS

Wikipedia, Acid Dissociation Constant, last modified Jan. 31, 2012, 21 pages, http://en.wikipedia.org/wiki/Acid_dissociation_constant.

* cited by examiner

*Primary Examiner* — Walter H Swanson
*Assistant Examiner* — Wilner Jean Baptiste
(74) *Attorney, Agent, or Firm* — TraskBritt (57) ABSTRACT

A method for cleaning a semiconductor structure includes subjecting a semiconductor structure to an aqueous solution including at least one fluorine compound, and at least one strong acid, the aqueous solution having a pH of less than 1. In one embodiment, the aqueous solution includes water, hydrochloric acid, and hydrofluoric acid at a volumetric ratio of water to hydrochloric acid to hydrofluoric acid of 1000: 32.5:1. The aqueous solution may be used to form a contact plug that has better contact resistance and improved critical dimension bias than conventional cleaning solutions.

22 Claims, 5 Drawing Sheets

SOLUTIONS FOR CLEANING SEMICONDUCTOR STRUCTURES AND RELATED METHODS

TECHNICAL FIELD

Embodiments of the present disclosure relate generally to semiconductor device fabrication. More particularly, the present disclosure relates to solutions suitable for cleaning of semiconductor devices and methods of using the solutions.

BACKGROUND

The fabrication of semiconductor devices often involves providing materials over a substrate and shaping those materials through processes such as photolithography and etching. For example, a dielectric material may be formed over a substrate using methods known in the art. The dielectric material may be patterned to form at least one opening through the dielectric material, exposing the substrate. This opening may be formed using a photolithography or etching process as known in the art. A conductive material may be formed in the opening to form a contact plug. The patterned dielectric material acts to electrically isolate adjacent contact plugs. However, because the substrate at the bottom of the at least one opening is exposed to air before forming the conductive material, a native oxide may foam on the substrate. Because this native oxide is an electrical insulator, if the native oxide remains on the substrate, the native oxide will hinder electrical communication between the substrate and the subsequently formed contact plug.

As a result, in-process devices at this stage of fabrication are often subjected to a cleaning process to remove the native oxide at the bottom of the at least one opening prior to forming a polysilicon material therein. The cleaning process may include a cleaning solution, such as at least one of QEII, MSe2, and ultradilute hydrofluoric acid (HF) (1000 parts water to 1 part HF). Either through immersion, spraying, vapor treatment, or other methods, the native oxide of the in-process device is exposed to and removed by the cleaning solution.

Unfortunately, while HF removes the native oxide from the bottom of the opening, the HF also may laterally etch the dielectric material that defines the opening. The result is that the diameter of the opening is increased. Widening the opening may be detrimental to semiconductor device fabrication because a wider opening means that there is less dielectric material separating adjacent conductive elements and an increased likelihood of a short between the adjacent conductive elements.

Accordingly, there is a need in the art for cleaning solutions and methods to effectively remove the native oxide without also removing a portion of the dielectric material.

DETAILED DESCRIPTION OF THE INVENTION

Solutions for cleaning of semiconductor structures and methods of cleaning semiconductor structures using such solutions are disclosed. The solution is a low pH, fluorine-containing solution. As used herein, the phrase "low pH, fluorine-containing solution" means and includes a solution that includes at least one fluoride compound and has a pH of less than about 1. The low pH, fluorine-containing solution may be used during the fabrication of a semiconductor structure, such as preliminary to the fabrication of a contact plug on a substrate.

The low pH, fluorine-containing solution may include water, at least one fluoride compound, and at least one strong acid. In the embodiments described herein, the fluoride compound is hydrofluoric acid (HF). However, other fluoride compounds may be utilized in addition to HF or in place thereof. For example, the fluoride compound may be ammonium fluoride ($NH_4F$), or a combination of HF and $NH_4F$. As used herein, the term "strong acid" means and includes an acid that ionizes completely in an aqueous solution by losing one proton. The strong acid may have an acid dissociation constant ($pK_a$) of less than about −2. For example, the at least one strong acid may include, but is not limited to, at least one of hydrochloric acid (HCl), nitric acid ($HNO_3$), sulfuric acid ($H_2SO_4$), hydrobromic acid (HBr), and hydroiodic acid (HI). In one embodiment, the at least one strong acid is HCl.

The at least one strong acid may be combined with the water and the at least one fluoride compound in a sufficient amount that the pH of the low pH, fluorine-containing solution is less than about 1. The amount of strong acid in the low pH, fluorine-containing solution may be significantly greater than the amount of fluoride compound in the low pH, fluorine-containing solution. The low pH, fluorine-containing solution may include from about 15 parts to about 65 parts of the strong acid. By way of example, the low pH, fluorine-containing solution may include a volumetric ratio of water to the fluoride compound of at least about 500:1, such as at least about 2000:1. The volumetric ratio of strong acid to fluoride compound in the low pH, fluorine-containing solution may be at least about 10:1, such as at least about 70:1. In one embodiment, the low pH, fluorine-containing solution is a solution of water, HCl, and HF, with a volumetric ratio of water to HCl to HF of about 1000:32:1. Additional components, such as a surfactant, may, optionally, be included in the low pH, fluorine-containing solution.

The low pH, fluorine-containing solution may be used to clean an intermediate structure of the semiconductor structure, which may also be characterized as an in-process semiconductor structure. The intermediate structure of the semiconductor structure may include a substrate having a dielectric material thereon, and at least one opening in the dielectric material. At least a portion of the substrate may be exposed through the at least one opening. The at least one opening may have an oxide therein. The intermediate structure may be subjected to the low pH, fluorine-containing solution before depositing polysilicon in the at least one opening. The low pH, fluorine-containing solution may remove the oxide from an interface between the substrate and polysilicon, which provides improved contact resistance to the semiconductor structure. The low pH, fluorine-containing solution may selectively remove the oxide in the opening relative to another oxide, such as a silicon oxide, a silane oxide, a thermal oxide, a spin-on dielectric, tetraethylorthosilicate (TEOS), or doped TEOS, on the intermediate structure. One example of such an intermediate structure is an intermediate structure 100 shown in FIG. 1A. Other and further embodiments will become apparent to those of ordinary skill in the art to which the invention pertains without departing from its scope.

Figure 1A:
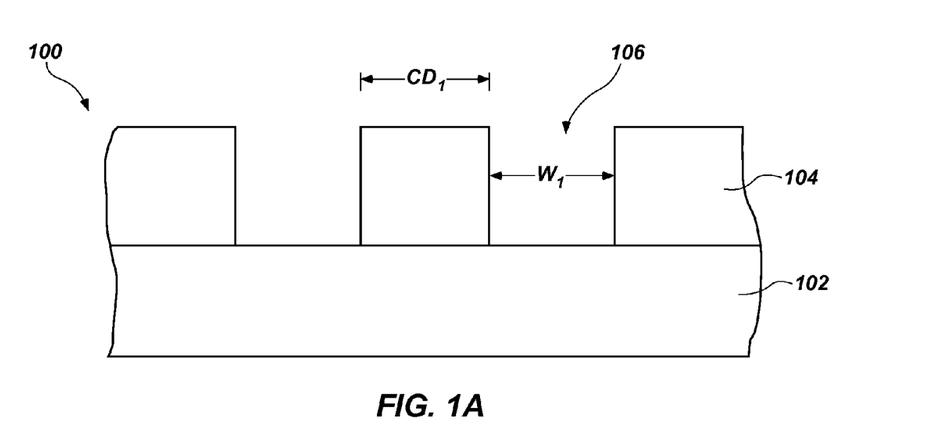
FIGS. 1A through 1D are cross-sectional views illustrating a method for forming a contact plug utilizing embodiments of the present disclosure.

The intermediate structure 100 of FIG. 1A includes a substrate 102 having a dielectric material 104 formed thereon. The substrate 102 may be a conventional silicon substrate or other bulk substrate including a layer of semiconductor material. As used herein, the term "bulk substrate" includes not only silicon wafers, but also silicon-on-insulator (SOI) substrates, silicon-on-sapphire (SOS) substrates, epitaxial layers of silicon on a base semiconductor foundation, and other semiconductor or optoelectronics materials, such as silicon-germanium, germanium, gallium arsenide, or indium phosphide. The material of the substrate 102 may be doped or undoped. In one embodiment, the substrate 102 is a monocrystalline silicon. The dielectric material 104 may be an insulative material known in the art, such as a silicon oxide, a silane oxide, silicon nitride, a thermal oxide, a spin-on dielectric (SOD), silicon oxynitride, a spin-on glass (SOG), a phosphosilicate glass (PSG), TEOS, doped TEOS, or borophosilicate glass (BPSG). In one embodiment, the dielectric material is a silicon oxide. The dielectric material 104 may be deposited or otherwise formed on the substrate 102 by conventional techniques, such as by plasma enhanced chemical vapor deposition (PECVD) or standard thermal CVD. The dielectric material 104 may be patterned, as known in the art, to form at least one opening 106, which has a width of $W_1$. The at least one opening 106 is formed through the dielectric material 104, exposing a portion of the substrate 102. The remaining dielectric material 104 may form features having a critical dimension $CD_1$.

Figure 1B:
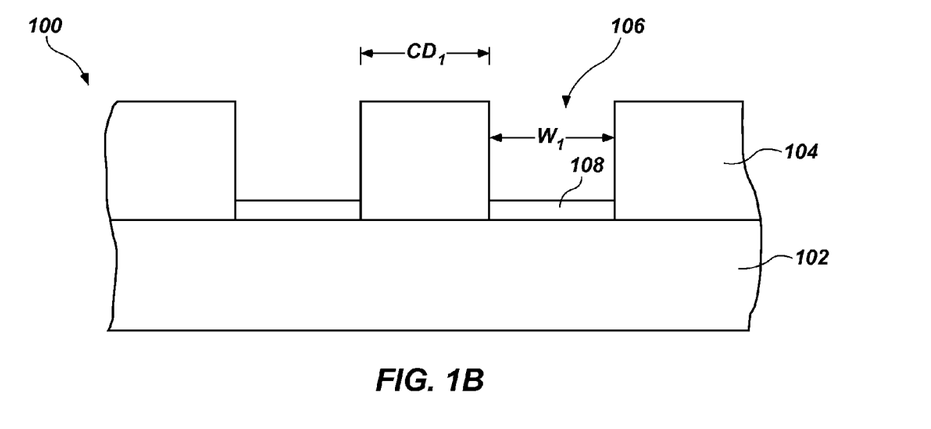
Figure 1C:
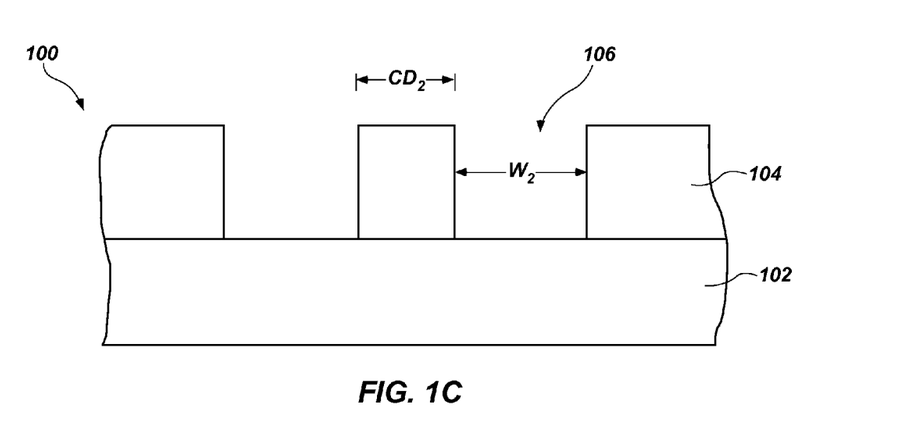

As shown in FIG. 1B, the portion of the substrate 102 exposed through the dielectric material 104 may react with oxygen in the atmosphere to form an oxide 108, such as a silicon oxide. The oxide 108 may be referred to herein as a so-called "native" oxide, also termed a "chemical" oxide that has grown or formed on the substrate 102. The native oxide 108 may be cleaned, etched, or otherwise removed, as shown in FIG. 1C, by exposing the intermediate structure 100 to the low pH, fluorine-containing solution. The low pH, fluorine-containing solution may be applied to the intermediate structure 100 by any method known in the art including, but not limited to, immersing the intermediate structure 100 into the low pH, fluorine-containing solution, spraying the low pH, fluorine-containing solution onto the intermediate structure 100, or applying a vapor of the low pH, fluorine-containing solution to the intermediate structure 100. The intermediate structure 100 may be exposed to the low pH, fluorine-containing solution at a temperature within a range of from about 10° C. to about 100° C. In one embodiment, the intermediate structure 100 is exposed to the low pH, fluorine-containing solution at room temperature (i.e., from about 20° C. to about 25° C.).

Figure 1D:
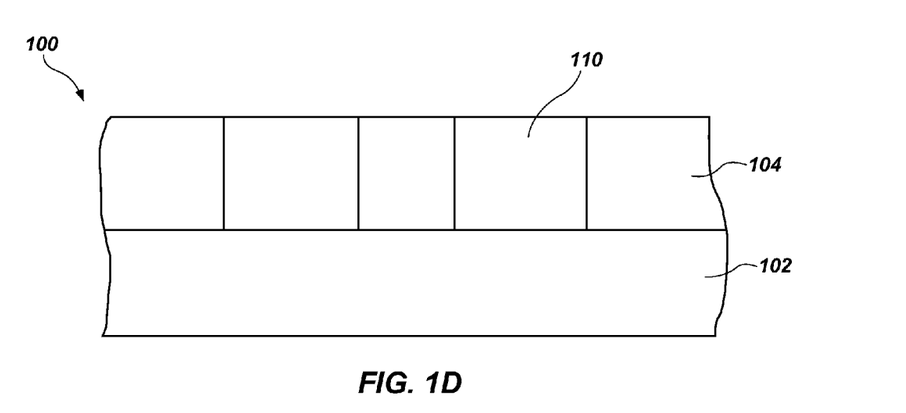

In addition to removing the native oxide 108, the low pH, fluorine-containing solution may also remove a portion of the dielectric material 104, causing a change in critical dimension of the features from $CD_1$ to $CD_2$. The reduction in critical dimension of the features of the dielectric material 104 causes the width of the opening 106 to increase from $W_1$ to $W_2$. However, the difference between the widths $W_1$ and $W_2$ may be minimal when using a low pH, fluorine-containing solution of an embodiment of the present disclosure to remove the native oxide 108. For example, the difference between the widths $W_1$ and $W_2$ may be less than about ten angstroms (10 nm), such as less than about five angstroms (5 nm). Once the native oxide 108 has been removed, a conductive material may be formed within the opening 106 to form a contact plug 110 as shown in FIG. 1D. The contact plug 110, in one embodiment, is formed of polycrystalline silicon or polysilicon. The polysilicon may be doped or undoped. In another embodiment, the contact plug 110 is formed of a suitable conductive material including, but not limited to, a metal, a metal alloy, a conductive metal nitride, a conductive metal alloy nitride, or combinations thereof. For example, the conductive material may be formed of tungsten (W), nickel (Ni), tantalum nitride (TaN), platinum (Pt), tungsten nitride (WN), gold (Au), titanium nitride (TiN), titanium (Ti) or titanium aluminum nitride (TiAlN). The intermediate structure 100 including the contact plug 110 (FIG. 1D) may be subjected to additional fabrication acts to form semiconductor devices, such as a NAND Flash memory device or a DRAM (Dynamic Random Access Memory) device. Since the additional semiconductor fabrication acts are conventional, these acts are not described in detail herein.

Without being bound by any theory, it is believed that since the pH of the low pH, fluorine-containing solutions of the embodiments of the present disclosure is less than about 1, the fluoride compound may not dissociate as quickly as a solution having a higher pH. Because the fluoride compound dissociates slower at a low pH, the native oxide 108 may be removed at a faster rate than the dielectric material 104. Therefore, using the low pH, fluorine-containing solution may provide a greater etch selectivity between the native oxide 108 and other exposed oxides on the intermediate structure 100 compared to using a conventional solution that includes water and HF. For example, if the dielectric material 104 includes a doped oxide material, such as BPSG, the doped oxide material may be removed by the low pH, fluorine-containing solution at a slower rate than the native oxide 108. This selectivity enables removal of the native oxide 108 without removing a substantial portion of the dielectric material 104. In addition, because the dielectric material 104 may be removed at a slower rate, the exposure time or "dip" time of the intermediate structure 100 in the low pH, fluorine-containing solution may increase. For example, the exposure time of the intermediate structure 100 in the low pH, fluorine-containing solution may be at least about 5 minutes, such as at least about 8 minutes. This prolonged exposure time in the low pH, fluorine-containing solution may increase the likelihood that substantially all of the native oxide 108 is removed. By removing substantially all of the native oxide 108, a lower contact resistance may be experienced between the substrate 102 and the contact plug 110. The length of exposure time of the intermediate structure 100 to the low pH, fluorine-containing solution may depend on the amount of fluoride compound in the low pH, fluorine-containing solution. The greater the ratio of fluoride compound to water and the strong acid in the low pH, fluorine-containing solution, the faster the low pH, fluorine-containing solution may remove the native oxide 108 and the dielectric material 104.

Use of the low pH, fluorine-containing solution to remove the native oxide 108 may also retard regrowth of the native oxide 108 before forming the conductive material in the opening 106 (i.e., before forming the contact plug 110). Without being bound by any theory, the strong acid in the low pH, fluorine-containing solution may provide an excess of protons ($H^+$), which react with and terminate loose electrons on the exposed portion of the substrate 102, passivating a surface of the substrate 102 with silicon-hydrogen bonds. As a result, the exposed portion of the substrate 102 may have increased resistance to reacting with ambient oxygen. Exposing the intermediate structure 100 to the low pH, fluorine-containing solution may prevent regrowth of the native oxide 108 for at least about two hours. In one embodiment, exposing the intermediate structure 100 to the low pH, fluorine-containing solution prevents regrowth of the native oxide 108 for at least about four hours. The prevention of native oxide 108 regrowth using the low pH, fluorine-containing solution may eliminate the need for storing the cleaned intermediate structure 100 in an atmosphere free of oxygen, such as a nitrogen ($N_2$) atmosphere. The prevention of the native oxide 108 regrowth using the low pH, fluorine-containing solution may also eliminate the need to clean the intermediate structure 100 with more than one process.

By using the low pH, fluorine-containing solution to remove the native oxide 108 without substantially removing the dielectric material 104, the contact resistance of a semiconductor device including the intermediate structure 100 may be improved and the CD bias (i.e., contact size) of the features formed from the dielectric material 104 may be decreased. Therefore, the methods of embodiments of the present disclosure may increase the marginality of contact-contact shorts. In addition, by utilizing the methods of the embodiments of the present disclosure, an improved interface between the substrate 102 and the contact plug 110 may be achieved. The low pH, fluorine-containing solution may also be less expensive than conventional cleaning solutions, such as QEII.

Figure 2:
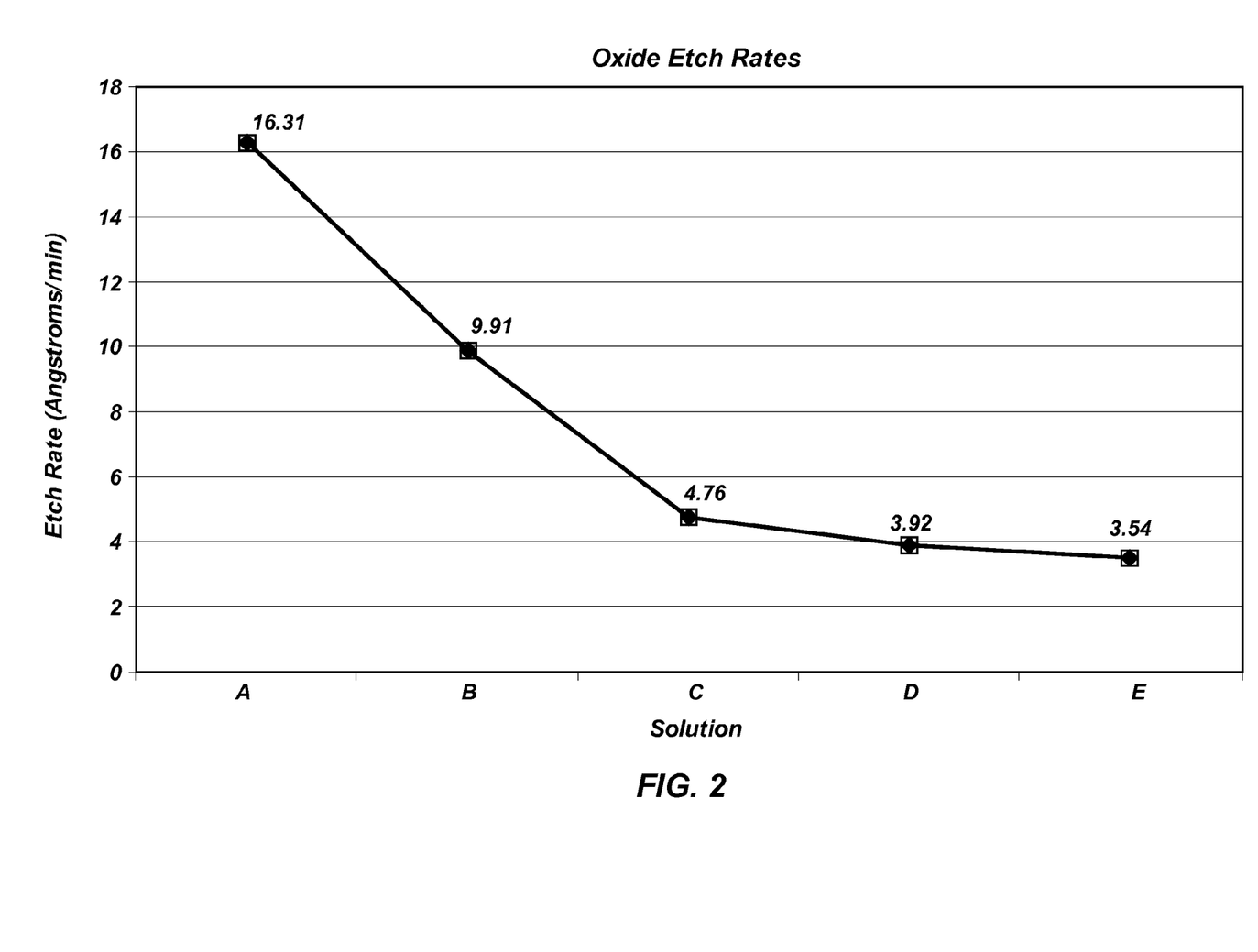
FIG. 2 is a graph showing oxide etch rates of conventional solutions and low pH, fluorine-containing solutions according to embodiments of the present disclosure.

Intermediate structures 100 similar to that shown in FIG. 1A were exposed to low pH, fluorine-containing solutions to determine the oxide etch rate, the change in CD bias before and after exposure, and the current resistance at an interface between the substrate 102 and the contact plug 110. The etch rate of the oxide was measured by conventional techniques, which are not described in detail herein. FIG. 2 shows the oxide etch rates for five solutions including HF, two of which are low pH, fluorine-containing solutions according to embodiments of the present disclosure. The three other solutions were tested as controls. The first three solutions (labeled A, B, and C in FIG. 2) are solutions having a pH greater than 1, while the fourth and fifth solutions (labeled D and E in FIG. 2) are low pH, fluorine-containing solutions according to embodiments of the present disclosure. Solution A included water and HF at a water to HF ratio of 1000:1 having a pH of about 2.9. The intermediate structure 100 was exposed to Solution A at room temperature and had an oxide etch rate of about 16.31 angstroms/min. Solution B included water and HF at a water to HF ratio of 2000:1 and a pH of about 2.7. The intermediate structure 100 was exposed to Solution B at an increased temperature of about 60° C., and had an oxide etch rate of about 9.91 angstroms/min. Solution C included water and HF at a water to HF ratio of about 2000:1 and a pH of about 2.7. The intermediate structure 100 was exposed to Solution C at room temperature and had an oxide etch rate of about 4.76 angstroms/min. Solution D included water, HCl, and HF at a water to HCl to HF ratio of about 1000:16:1 and had a pH of below about 1. The intermediate structure 100 was exposed to Solution D at room temperature and had an oxide etch rate of about 3.92 angstroms/min. Solution E included water, HCl, and HF at a water to HCl to HF ratio of about 1000:32.5:1 and had a pH of about 0.6. The intermediate structure 100 was exposed to Solution E at room temperature and had an oxide etch rate of about 3.54 angstroms/min. Solutions A-C, which had a pH of greater than 1, had higher etch rates than Solutions D and E, which had a pH of less than about 1. Accordingly, by decreasing the pH of the solutions, in accordance with embodiments of the present disclosure, the oxide etch rates may be reduced by utilizing the low pH, fluorine-containing solutions including the fluoride compound and the strong acid. The reduced etch rate may enable an increase in exposure time of the intermediate structure 100 to the low pH, fluorine-containing solutions, as previously discussed.

Figure 3A:
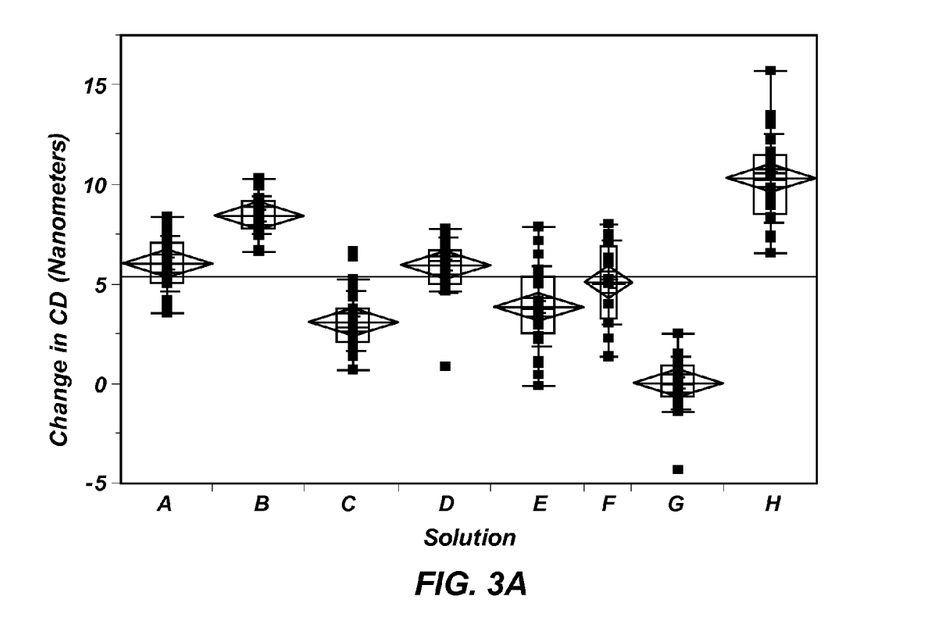
FIGS. 3A and 3B are graphs showing a change in critical dimension of a feature formed from a dielectric material that has been exposed to conventional solutions and low pH, fluorine-containing solutions according to embodiments of the present disclosure.
Figure 3B:
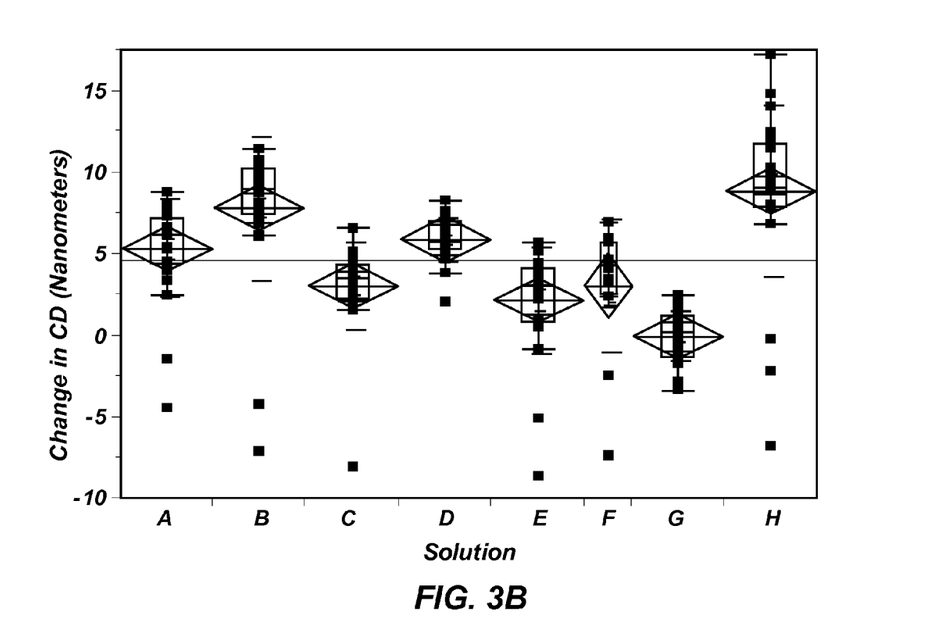

FIGS. 3A and 3B are graphs illustrating the change in critical dimension of the dielectric material of the intermediate structure 100, such as the difference between the critical dimensions $CD_1$ and $CD_2$ of the dielectric material 104 illustrated in FIGS. 1B and 1C, before and after cleaning using various solutions. In this example, the dielectric material 104 comprised a spin-on dielectric material. The difference between the critical dimensions $CD_1$ and $CD_2$ of the dielectric material 104 was taken at two different locations on the intermediate structure 100. FIG. 3A illustrates the change in critical dimension (CD) at a first location and FIG. 3B illustrates the change in critical dimension (CD) at a second location. Solutions A, B, E, F, G, and H are solutions known in the art, while the Solutions C and D are low pH, fluorine-containing solutions according to embodiments of the present disclosure. Intermediate structures 100 similar to that shown in FIG. 1A were exposed to the various solutions at room temperature unless otherwise stated. Solution A included water and HF at a water to HF ratio of about 1000:1 and the intermediate structure 100 was exposed to Solution A for about 5 minutes. Solution A resulted in an about 6.0 nm change in critical dimension of the dielectric material at the first location (FIG. 3A) and an about 6.3 Å nm change in critical dimension of the dielectric material at the second location (FIG. 3B). Solution B included water and HF at a water to HF ratio of about 1000:1 and the intermediate structure 100 was exposed to Solution B for about 8 minutes. Solution B resulted in an about 8.3 nm change in critical dimension of the dielectric material at the first location (FIG. 3A) and an about 8.9 nm change in critical dimension of the dielectric material at the second location (FIG. 3B). Solution C included water, HCl, and HF at a water to HCl to HF ratio of about 1000:32.5:1 and the intermediate structure 100 was exposed to Solution C for about 5 minutes. Solution C resulted in an about 2.8 nm change in critical dimension of the dielectric material at the first location (FIG. 3A) and an about 3.4 nm change in critical dimension of the dielectric material at the second location (FIG. 3B). Solution D included water, HCl, and HF at a water to HCl to HF ratio of about 1000:32.5:1 and the intermediate structure 100 was exposed to Solution D for about 8 minutes. Solution D resulted in an about 6.2 nm change in critical dimension of the dielectric material at the first location (FIG. 3A) and an about 5.7 nm change in critical dimension at the dielectric material at the second location (FIG. 3B). Solution E included a vapor HF etch followed by ammonium hydroxide ($NH_4OH$) and hydrogen peroxide ($H_2O_2$), which is commonly referred to in the art as an "APM solution." The intermediate structure 100 was exposed to Solution E for about 2 minutes. Solution E resulted in an about 3.7 nm change in critical dimension of the dielectric material at the first location (FIG. 3A) and an about 3.0 nm change in critical dimension of the dielectric material at the second location (FIG. 3B). Solution F is another vapor HF etch followed by APM solution and the intermediate structure 100 was exposed to Solution F for about 3 minutes. Solution F resulted in an about 5.3 nm change in critical dimension of the dielectric material at the first location (FIG. 3A) and an about 4.2 nm change in critical dimension of the dielectric material at the second location (FIG. 3B). Solution G included water and HF at a water to HF ratio of about 2000:1. The intermediate structure 100 was exposed to Solution G for about 5 minutes at an elevated temperature of at least about 60° C. Solution G resulted in an about 0.0075 nm change in critical dimension of the dielectric material at the first location (FIG. 3A) and an about 0.16 nm change in critical dimension of the dielectric material at the second location (FIG. 3B). Solution H included 30% ammonium fluoride, 1% phosphoric acid, and 69% water, which is commonly referred to in the art as a "QEII solution." Solution H resulted in an about 10.5 nm change in critical dimension of the dielectric material at the first location (FIG. 3A) and an about 9.5 nm change in critical dimension of the dielectric material at the second location (FIG. 3B).

As shown in FIGS. 3A and 3B, exposing the intermediate structures 100 to the low pH, fluorine-containing solutions according to embodiments of the present disclosure (Solutions C and D) resulted in a lesser change in critical dimension of features of the dielectric material 104 than exposing the intermediate structures 100 to HF solutions having a higher pH and the QEII solution. Because of the lesser change in critical dimension of features of the dielectric material 104, cleaning with the low pH, fluorine-containing solutions may help to reduce or prevent shorts between adjacent contact plugs.

Figure 4A:
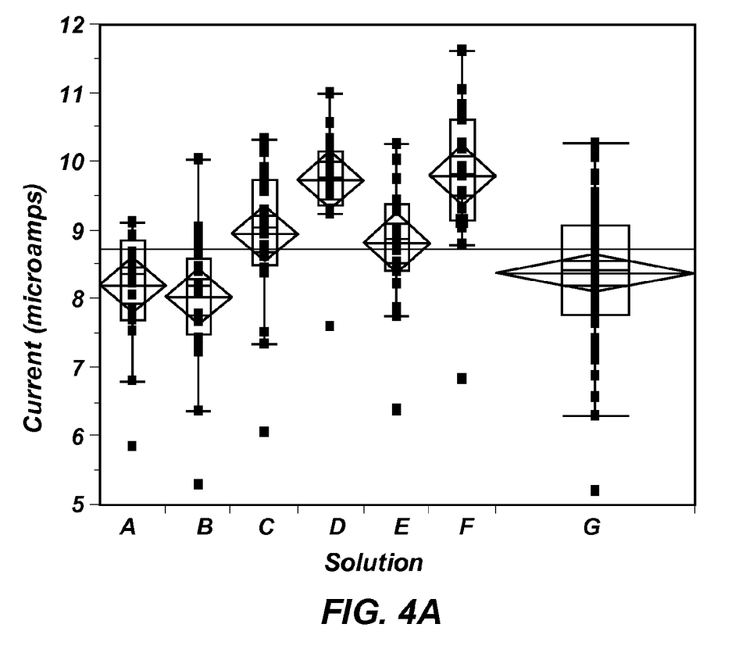
FIGS. 4A and 4B are graphs showing a drive current through a contact plug formed according to embodiments of the present disclosure.
Figure 4B:
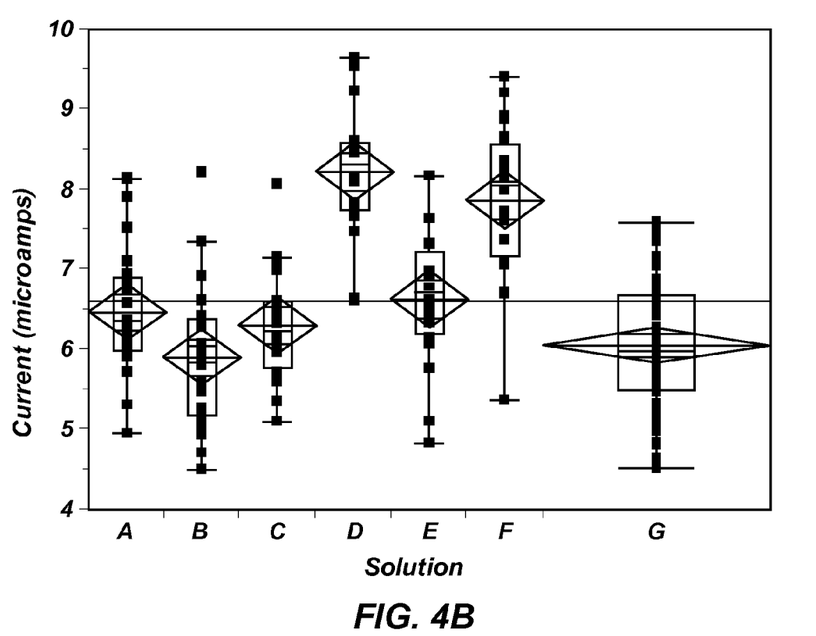

FIGS. 4A and 4B are graphs illustrating the current that passes through an interface between the substrate 102 and the contact plug 110 (FIG. 1D) at two different locations on the intermediate structure 100 after the semiconductor structure 100 has been cleaned with various solutions. Intermediate structures 100 similar to that shown in FIG. 1A were exposed to the solutions and the current passing therethrough was measured by conventional techniques, which are not described in detail herein. Solutions A, B, C, F, and G are solutions known in the art, while Solutions D and E are low pH, fluorine-containing solutions according to embodiments of the present disclosure. The intermediate structures 100 were exposed to each of the solutions at room temperature unless otherwise stated. Solution A included water and HF at a water to HF ratio of about 1000:1 and the intermediate structure 100 was exposed to Solution A for about 3 minutes. Solution A resulted in an about 8.3 microamp current through the interface at the first location (FIG. 4A) and an about 6.4 microamp current through the interface at the second location (FIG. 4B). Solution B included water and HF at a water to HF ratio of about 1000:1 and the intermediate structure 100 was exposed to Solution B for about 5 minutes. Solution B resulted in an about 8.2 microamp current through the interface at the first location (FIG. 4A) and an about 5.8 microamp current through the interface at the second location (FIG. 4B). Solution C included water and HF at a water to HF ratio of about 1000:1 and the intermediate structure 100 was exposed to Solution C for about 8 minutes. Solution C resulted in an about 9.0 microamp current through the interface at the first location (FIG. 4A) and an about 6.2 microamp current through the interface at the second location (FIG. 4B). Solution D included water, HCl, and HF a water to HCl to HF ratio of about 1000:32.5:1 and the intermediate structure 100 was exposed to Solution D for about 8 minutes. Solution D resulted in an about 9.8 microamp current through the interface at the first location (FIG. 4A) and an about 8.3 microamp current through the interface at the second location (FIG. 4B). Solution E included water, HCl, and HF at a water to HCl to HF ratio of about 1000:32.5:1 and the intermediate structure 100 was exposed to Solution E for about 5 minutes. Solution E resulted in an about 8.9 microamp current through the interface at the first location (FIG. 4A) and an about 6.1 microamp current through the interface at the second location (FIG. 4B). Solution F included a vapor HF solution having an exposure time of 2 minutes followed by an APM solution having an exposure time of about 2 minutes. Solution F resulted in an about 9.8 microamp current through the interface at the first location (FIG. 4A) and an about 8.1 microamp current through the interface at the second location (FIG. 4B). Solution G was a QEII solution and the intermediate structure 100 was exposed to Solution G for about 30 seconds. Solution G resulted in an about 8.4 microamp current through the interface at the first location (FIG. 4A) and an about 6.0 microamp current through the interface at the second location (FIG. 4B).

As shown in FIGS. 4A and 4B, exposing the intermediate structure 100 to the low pH, fluorine-containing solutions (Solutions C and D) provided a high current, or low current resistance, through the interface of the contact plug 110 and the substrate 102 (FIG. 1D) relative to semiconductor structures cleaned with the other solutions. Accordingly, exposing the intermediate structure 100 to the low pH, fluorine-containing solutions of embodiments of the present disclosure forms an intermediate structure 100 having a desired critical dimension, $CD_2$, of features of the dielectric material 104 as well as a contact plug 110 having a low current resistance.

In additional embodiments, after exposing the intermediate structure 100 to the low pH, fluorine containing solutions as described herein, the intermediate structure 100 may be exposed to a low pH rinse. The low pH rinse may have a pH less than about 3. In some embodiments the low pH rinse may have a pH less than about 1. While the term "rinse" is used to describe low pH rinse, it is understood that the intermediate structure 100 may be exposed to the low pH rinse for any desired amount of time. For example, the intermediate structure 100 may be exposed to the low pH rinse for a time of about thirty seconds to about twenty minutes. The low pH rinse may comprise deionized water and a strong acid. For example, the low pH rinse may include deionized water and at least one of hydrochloric acid (HCl), nitric acid ($HNO_3$), sulfuric acid ($H_2SO_4$), hydrobromic acid (HBr), and hydroiodic acid (HI). In one embodiment, the low pH rinse is deionized water and HCl.

Exposing the intermediate structure 100 to the low pH rinse may help to further lower a contact resistance between the contact plug 110 and the substrate 102. In some embodiments, exposing the intermediate structure 100 to the low pH, fluorine containing solution and the low pH rinse may lower the contact resistance of the contact plug 110 by at least about eight percent when compared to exposing the intermediate structure 100 to the low pH, fluorine containing solutions alone. For example, the intermediate structure 100 was cleaned with a solution that included water, HCl, and HF having a water to HCl to HF ratio of about 1000:32.5:1 and exposing the intermediate structure 100 to solution for about 8 minutes. This resulted in an about 8.3 microamp current through the interface between the contact plug 110 and the substrate 102. The intermediate structure 100 that was cleaned with the water, HCl, and HF solution was then exposed to an HCl rinse. The HCl rinse resulted in an about 8.9 microamp current through the interface between the contact plug 110 and the substrate 102. Accordingly, by exposing the intermediate structure 100 to the low pH, fluorine-containing solutions of embodiments of the present disclosure followed by the pH rinse forms an intermediate structure 100 having a contact plug 110 having an even lower current resistance.

In summary, using the low pH, fluorine-containing solutions according to embodiments of the present disclosure produced intermediate structures 100 having from about 4 nm to about 8 nm lower CD bias compared to using the QEII solution or the HF solutions lacking the strong acid. Using the low pH, fluorine-containing solutions according to embodiments of the present disclosure also produced intermediate structures 100 having from about 10% to about 35% higher access drive current (lower contact resistance) compared to using the QEII solution or HF solutions lacking the strong acid. Still further, by rinsing the intermediate structures 100 with a low pH rinse after cleaning the intermediate structures 100 with the low pH, fluorine-containing solutions, the intermediate structures 100 may be formed having an at least about 8% higher drive current (lower contact resistance) compared to using only the low pH, fluorine-containing solutions.

The present disclosure has been described in relation to particular embodiments that are intended in all respects to be illustrative rather than restrictive. It is to be understood that the invention defined by the appended claims and legal equivalents thereof is not to be limited by particular details set forth in the above description and that alternative embodiments will become apparent to those of ordinary skill in the art to which the present disclosure pertains without departing from the scope thereof.

Conclusion

In some embodiments, the present disclosure includes a method for cleaning a semiconductor structure. The method includes subjecting a semiconductor structure comprising a dielectric material having at least one opening therein to a solution having a pH of less than about 1 and comprising water, at least one fluoride compound, and at least one strong acid. In additional embodiments, the present disclosure includes a method of forming a contact plug. In addition, the method includes forming a dielectric material over a substrate. At least one opening may be formed through the dielectric material to expose at least a portion of the substrate. The dielectric material and the at least a portion of the substrate are subjected to an aqueous solution having a pH of less than about 1 and comprising hydrofluoric acid. A conductive material is disposed within the at least one opening.

In additional embodiments, the present disclosure includes an aqueous solution for cleaning a semiconductor structure. The aqueous solution has a pH of less than about 1 and includes water, at least one fluorine compound and at least one strong acid. In some embodiments, the aqueous solution includes water, hydrochloric acid, and hydrofluoric acid wherein a ratio of water to hydrochloric acid to hydrofluoric acid is 1000:32.5:1.

What is claimed is:

1. A method for cleaning a semiconductor structure, comprising:
    subjecting a semiconductor structure comprising a dielectric material having at least one opening therein to a solution having a pH of less than about 1 and comprising water, at least one fluoride compound, and at least one acid having an acid dissociation constant ($pK_a$) of less than about −2, the solution having a volumetric ratio of the water to the at least one fluoride compound of at least 500:1.

2. The method of claim 1, wherein the subjecting the semiconductor structure comprising the dielectric material having the at least one opening therein to the solution comprising water, the at least one fluoride compound, and the at least one acid comprises subjecting the semiconductor structure to a solution comprising water, hydrofluoric acid, and at least one of hydrochloric acid, nitric acid, sulfuric acid, hydrobromic acid, and hydroiodic acid.

3. The method of claim 1, wherein the subjecting the semiconductor structure comprising the dielectric material having the at least one opening therein to the solution comprising water, the at least one fluoride compound, and the at least one acid comprises subjecting the semiconductor structure to a solution comprising water, hydrochloric acid, and hydrofluoric acid, wherein a ratio of water to hydrochloric acid to hydrofluoric acid is 1000:32.5:1.

4. The method of claim 1, wherein the subjecting the semiconductor structure comprising the dielectric material having the at least one opening therein to the solution comprising water, the at least one fluoride compound, and the at least one acid comprises subjecting the semiconductor structure to the solution for a period of time ranging from about 5 minutes to about 8 minutes.

5. The method of claim 1, wherein the subjecting the semiconductor structure comprising the dielectric material having the at least one opening therein to the solution comprising water, the at least one fluoride compound, and the at least one acid comprises removing a native oxide formed in the at least one opening of the dielectric material.

6. The method of claim 5, wherein removing a native oxide comprises removing the native oxide faster than removing the dielectric material.

7. The method of claim 5, wherein removing a native oxide comprises removing the native oxide at a rate of from about 3.5 angstroms/minute to about 4.0 angstroms/minute.

8. The method of claim 1, further comprising subjecting the semiconductor structure to a low pH rinse.

9. The method of claim 8, wherein the low pH rinse comprises HCl and deionized water.

10. A method of forming a contact plug, the method comprising:
    forming a dielectric material over a substrate;
    forming at least one opening through the dielectric material to expose at least a portion of the substrate;
    subjecting the dielectric material and the exposed at least a portion of the substrate to an aqueous solution having a pH of less than about 1 and comprising hydrofluoric acid and at least one other acid, the at least one other acid having an acid dissociation constant ($pK_a$) of less than about −2 ; and
    forming a conductive material within the at least one opening.

11. The method of claim 10, wherein forming the dielectric material over a substrate comprises forming a silicon oxide, a silane oxide, a thermal oxide, a spin-on dielectric, silicon oxynitride, a spin-on glass, a phosphosilicate glass, tetraethylorthosilicate, doped tetraethylorthosilicate, or borophosilicate glass over the substrate.

12. The method of claim 10, wherein the subjecting the dielectric material and the exposed at least a portion of the substrate to an aqueous solution comprises removing a native oxide formed on the exposed at least a portion of the substrate.

13. The method of claim 12, wherein the subjecting the dielectric material and the exposed at least a portion of the substrate to an aqueous solution comprises retarding regrowth of the native oxide on the exposed at least a portion of the substrate.

14. The method of claim 13, wherein retarding the regrowth of the native oxide comprises retarding regrowth of the native oxide for at least about two hours.

15. The method of claim 10, wherein the forming a conductive material within the at least one opening comprises forming polycrystalline silicon in contact with the substrate comprising monocrystalline silicon.

16. The method of claim 10, wherein the subjecting the dielectric material and the exposed at least a portion of the substrate to an aqueous solution comprising hydrofluoric acid and at least one other acid comprises subjecting the dielectric material and the exposed at least a portion of the substrate to an aqueous solution comprising hydrofluoric acid and hydrochloric acid.

17. The method of claim 10, wherein the subjecting the dielectric material and the exposed at least a portion of the substrate to an aqueous solution comprises subjecting the dielectric material and the exposed at least a portion of the substrate to the aqueous solution at a temperature of about 10° C. to about 100° C.

18. A solution for cleaning a semiconductor structure, the solution having a pH of less than about 1 and comprising water, at least one fluoride compound, and at least one acid having an acid dissociation constant ($pK_a$) of less than about −2, the solution having a volumetric ratio of the water to the at least one fluoride compound of at least 500:1.

19. The solution of claim 18, wherein the at least one acid comprises at least one of hydrochloric acid, nitric acid, sulfuric acid, hydrobromic acid, and hydroiodic acid.

20. The solution of claim 18, wherein the at least one fluoride compound comprises hydrofluoric acid.

21. The solution of claim 18, wherein the solution comprises from about ten times to about seventy times by volume more of the at least one acid having an acid dissociation constant ($pK_a$) of less than about −2 than the at least one fluoride compound.

22. The solution of claim 18, wherein the solution comprises water, hydrochloric acid, and hydrofluoric acid at a volumetric ratio of water to hydrochloric acid to hydrofluoric acid of 1000:32.5:1.

* * * * *

UNITED STATES PATENT AND TRADEMARK OFFICE
CERTIFICATE OF CORRECTION

PATENT NO. : 8,546,016 B2
APPLICATION NO. : 12/986770
DATED : October 1, 2013
INVENTOR(S) : Sanjeev Sapra et al.

Page 1 of 1

It is certified that error appears in the above-identified patent and that said Letters Patent is hereby corrected as shown below:

In the Claims

In column 10, line 49, in Claim 11, delete "over a" and insert -- over the --, therefor.

In column 10, lines 52-53, in Claim 11, delete "borophosilicate" and insert -- borophosphosilicate --, therefor.

In column 10, line 66, in Claim 15, delete "wherein the forming a" and insert
-- wherein forming the --, therefor.

Signed and Sealed this
Twenty-eighth Day of January, 2014

Michelle K. Lee
*Deputy Director of the United States Patent and Trademark Office*